(12) United States Patent
Allen et al.

(10) Patent No.: US 7,934,190 B1
(45) Date of Patent: Apr. 26, 2011

(54) MULTIPLE AMPLIFIER MATCHING OVER LUMPED NETWORKS OF ARBITRARY TOPOLOGY

(75) Inventors: Jeffery C. Allen, San Diego, CA (US); David F. Schwartz, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 406 days.

(21) Appl. No.: 12/238,353

(22) Filed: Sep. 25, 2008

(51) Int. Cl.
*G06F 17/50* (2006.01)

(52) U.S. Cl. ........ 716/132; 716/111; 716/119; 716/136; 703/16

(58) Field of Classification Search .................. 716/2, 9, 716/10, 13, 14, 5, 111, 119, 132, 136; 703/16
See application file for complete search history.

(56) References Cited

U.S. PATENT DOCUMENTS

| | | | |
|---|---|---|---|
| 4,785,267 A | 11/1988 | Covill | |
| 5,274,341 A | 12/1993 | Sekine et al. | |
| 5,339,057 A | 8/1994 | Rauscher | |
| 5,574,402 A | 11/1996 | Nakajima et al. | |
| 5,903,854 A | 5/1999 | Abe et al. | |
| 6,111,459 A | 8/2000 | Nishijima et al. | |
| 6,313,699 B1 | 11/2001 | Nishijima et al. | |
| 6,313,700 B1 | 11/2001 | Nishijima et al. | |
| 6,320,462 B1 | 11/2001 | Alley | |
| 6,489,843 B1 | 12/2002 | Nishijima et al. | |
| 6,658,265 B1 | 12/2003 | Steel et al. | |
| 6,765,540 B2 | 7/2004 | Toncich | |
| 6,816,714 B2 | 11/2004 | Toncich | |
| 6,825,818 B2 | 11/2004 | Toncich | |
| 6,859,104 B2 | 2/2005 | Toncich et al. | |
| 6,903,612 B2 | 6/2005 | Toncich et al. | |
| 6,922,102 B2 | 7/2005 | Myer et al. | |
| 7,009,455 B2 | 3/2006 | Toncich et al. | |
| 7,053,717 B2 | 5/2006 | Gresham et al. | |
| 7,064,606 B2 | 6/2006 | Louis | |
| 7,221,327 B2 | 5/2007 | Toncich | |
| 7,239,852 B2 | 7/2007 | Yang et al. | |
| 7,614,021 B1 * | 11/2009 | Allen | 716/136 |
| 2002/0149428 A1 | 10/2002 | Toncich et al. | |

(Continued)

OTHER PUBLICATIONS

Keen et al., "Active Nonreciprocal 2-port Network Synthesis with Operational-Amplifier Realisations", Proceedings of the Institution of Electrical Engineers, vol. 115, No. 7, Jul. 1968, pp. 918-923.*
Kennedy, "Electronic Circuits Analysis Using Transformation Matrices in Conjunction With the Multi-node Method", Radio and Electronic Engineer, vol. 39, No. 5, May 1970, pp. 235-248.*
Bruccoleri, Federico; Erik A. M. Klumperink; Bram Nauta, Generating All Two-MOS Transistor Amplifiers Leads to New Wide-Band LNA's, journal, 2001, pp. 1032-1040, vol. 6 No. 7, IEEE Journal of Solid-State Circuits.

(Continued)

*Primary Examiner* — Phallaka Kik
(74) *Attorney, Agent, or Firm* — Ryan J. Friedl; Kyle Eppele

(57) ABSTRACT

A method includes generating at least one matrix representing a two-port, generating gain, noise, and stability functions of a system comprising the two-port, a generator connected to one port of the two-port, the generator having a generator reflectance, and a load connected to the other port of the two-port, the load having a load reflectance, and optimizing the gain, noise, and stability functions. The two-port comprises a non-reactive multi-port modeled by an orthogonal matrix, and at least one amplifier connected to the non-reactive multi-port. The orthogonal matrix is parameterized using an exponential map of skew-symmetric matrices having components restricted to an interval from $-\pi$ to $\pi$. The gain, noise, and stability functions are generated using the generated matrix, the generator reflectance, and the load reflectance, The gain, noise, and stability functions are parameterized by the skew-symmetric matrices.

16 Claims, 14 Drawing Sheets

U.S. PATENT DOCUMENTS

| | | |
|---|---|---|
| 2002/0149439 A1 | 10/2002 | Toncich |
| 2002/0149535 A1 | 10/2002 | Toncich |
| 2002/0151279 A1 | 10/2002 | Toncich et al. |
| 2002/0151291 A1 | 10/2002 | Toncich |
| 2002/0175878 A1 | 11/2002 | Toncich |
| 2004/0174220 A1 | 9/2004 | Toncich et al. |
| 2004/0189380 A1 | 9/2004 | Myer et al. |
| 2004/0189381 A1 | 9/2004 | Louis |
| 2005/0026571 A1 | 2/2005 | Yang et al. |
| 2005/0077966 A1 | 4/2005 | Gresham et al. |
| 2005/0085200 A1 | 4/2005 | Toncich |
| 2005/0095998 A1 | 5/2005 | Toncich |
| 2006/0232342 A1 | 10/2006 | Floyd et al. |
| 2007/0018758 A1 | 1/2007 | Fukuda et al. |

OTHER PUBLICATIONS

Kerherve, Eric; Pierre Jarry; Pierre-Marie Martin, Design of Broad-Band Matching Network with Lossy Junctions Using the Real-Frequency Technique, journal, 1998, pp. 242-249, vol. 46, No. 3, IEEE Transactions on Microwave Theory and Techniques.

Zhu, Lizhong; Boxiu Wu; Chuyu Sheng, Real Frequency Technique Applied to the Synthesis of Lumped Broad-Band Matching Networks with Arbitrary Nonuniform Losses for MMIC's, journal, 1998, pp. 1614-1620, vol. 36 No. 12, IEEE Transactions on Microwave Theory and Techniquest.

Allen, Jeffery C., H-Infinigy Engineering and Amplifier Optimization, book, Jul. 2004, Birkhauser Verlag, pp. vii-xiii, 25-28, 175-192.

* cited by examiner

MULTIPLE AMPLIFIER MATCHING OVER LUMPED NETWORKS OF ARBITRARY TOPOLOGY

FEDERALLY-SPONSORED RESEARCH AND DEVELOPMENT

Multiple Amplifier Matching over Lumped Networks of Arbitrary Topology is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice 619-553-2778; email T2@spawar.navy.mil. Reference Navy Case 83938.

BACKGROUND

The multiple amplifier matching problem involves placing one or more amplifiers into a lumped network to maximize the transducer power gain, minimize the noise figure, and maintain stability. An optimally designed lumped network permits the largest input signal to be stably transferred to the output.

Typically, amplifier matching is performed by the amplifier designer fixing a circuit topology, constraining the lumped element values, and undertaking a multi-objective optimization over the constrained element values. The difficulty with this approach is that there are many lumped network topologies, forcing the amplifier designer to undertake a massive search to determine an optimal lumped network topology.

A need exists for a method that can be used by amplifier designers to, given multiple amplifiers, determine an optimal lumped network topology that maximizes gain, minimizes noise, and maintains stability.

SUMMARY OF SOME EMBODIMENTS

Systems and methods are provided that in some embodiments an algorithm is obtained for determining optimal gain-noise-stability curves attainable for a physically realizable active circuit, by matching a given collection of amplifiers over all possible lumped networks of specified degree. A mathematical representation of the lumped network is generated and manipulated into a form that evaluates the performance of all active circuits to compute optimal performance limitations.

In accordance with one aspect of the present disclosure, a method for evaluating a lumped network of specified degree, designed to match an amplifier, is provided. The method may comprise: generating a representation of a non-reactive multiport containing a specified number of resistors, inductors, and capacitors formulated into an augmented load; generating a state-space representation of the non-reactive multiport, wherein ports of the non-reactive multiport are mapped to the specified the resistors, inductors, and capacitors, and amplifiers to form an active circuit; and parameterizing the non-reactive multiport, to enable a numerically efficient optimization of a performance of the active circuit over all possible topologies, wherein the performance of the circuit can be evaluated using topology as an adjustable parameter.

In accordance with another aspect of the present disclosure, a computer readable medium, containing instructions for evaluating a lumped network of specified degree, designed to match at least one amplifier is provided, the instructions comprising: generating a representation of a non-reactive multiport containing a specified number of resistors, inductors, and capacitors formulated into an augmented load; generating a state-space representation of the non-reactive multiport, wherein ports of the non-reactive multiport are mapped to the specified the resistors, inductors, and capacitors, and amplifiers to form an active circuit; and parameterizing the non-reactive multiport, to enable a numerically efficient optimization of a performance of the active circuit over all possible topologies, wherein the performance of the circuit can be evaluated using topology as an adjustable parameter.

In accordance with another aspect of the present disclosure, a system for evaluating a lumped, non-reactive multiport circuit of specified degree, designed to match an amplifier is provided, comprising: a computer; and a computer program, the computer program executing instructions comprising: generating a representation of a non-reactive multiport containing a specified number of resistors, inductors, and capacitors formulated into an augmented load; generating a state-space representation of the non-reactive multiport, wherein ports of the non-reactive multiport are mapped to the specified the resistors, inductors, and capacitors, and amplifiers to form an active circuit; and parameterizing the non-reactive multiport, to enable a numerically efficient optimization of a performance of the active circuit over all possible topologies, wherein the performance of the circuit can be evaluated using topology as an adjustable parameter.

DETAILED DESCRIPTION OF SOME EMBODIMENTS

Figure 1:
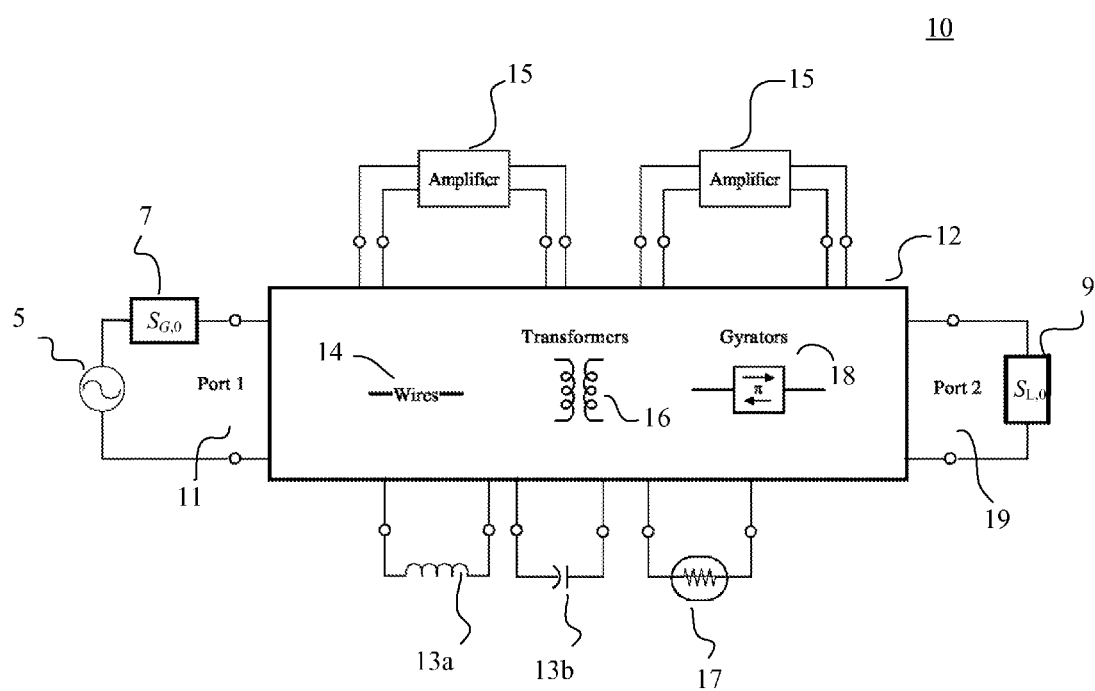
FIG. 1 shows a network schematic of a generalized multiple amplifier matching problem.

FIG. 1 shows a schematic of a network 10 of the amplifier matching problem. The network 10 contains a non-reactive multiport 12 characterized with non-reactive devices such as arbitrary wires 14, transformers 16 and gyrators 18. The non-reactive multiport 12 is coupled via port 1 (11) to an input, and via port 2 (19) to an output. The input is typically characterized as a source and source load. The output is typically characterized as a load. The reactance elements, such as inductors and capacitors, are illustrated as lumped reactances 13a and 13b, respectively, which are attached to the non-reactive multiport 12. FIG. 1 also illustrates connections to the amplifiers 15 so that the entire system is an active circuit.

When designing a lumped network, the amplifier designer is given one or more amplifiers 15 to implement in the network 10, whereas amplifier matching is a significant design objective. The amplifier designer is given $N_A$ amplifiers 15. These amplifiers 15 are connected to a non-reactive multiport containing $N_L$ inductors, $N_C$ capacitors, and $N_R$ resistors, often described in the aggregate as non-reactive multiport 12. Port 1 (11) into the non-reactive multiport 12 is connected to a signal generator 5 with reflectance $S_{G,0}$ 7. Port 2 (19) is terminated in the load reflectance $S_{L,0}$ 9.

The difficulties in this approach are, in many ways, overcome with the exemplary methods and systems provided in the forthcoming description. However, prior to presenting the exemplary methods and systems, an outline on the relevant circuit theory and practice is provided. Specifically, a discussion of the amplifier matching problem in the scattering formalism using an N-port system is presented. Next, the nomenclature for N-port scattering formalism is thereafter described. Afterwards, the gain, noise, and stability functions are presented.

The Scattering Formalism

General Notation: The real and complex numbers are denoted by R and C, respectively. The real M×N matrices are denoted by $R^{M \times N}$. The complex M×N matrices are denoted by $C^{M \times N}$. The Hermitian or conjugate transpose of a matrix S in $C^{M \times N}$ is denoted by $S^H$. The M×M identity matrix is denoted by $I_M$. The M×M zero matrix is denoted by $0_M$. Complex frequency is denoted by $p = \sigma + j\omega$.

Using the power-wave scattering formalism to discuss the matching N-port, an N-port is a "non-reactive multiport" with N pairs of terminals sticking out of it, so to speak. The use of the word "port" means that each pair of terminals obeys a conservation of current the current flowing into one terminal of the pair equals the current flowing out of the other terminal.

It should be appreciated that while the embodiments detailed herein will be described in the context of characterizing an unknown device in terms of its scattering waves (S-parameters) which enter and exit the ports of the unknown device, other formalism may be used as appropriate. For example, Y-parameters, Z-parameters, H-parameters, and so forth may be used without departing from the spirit and scope of this disclosure.

Figure 2:
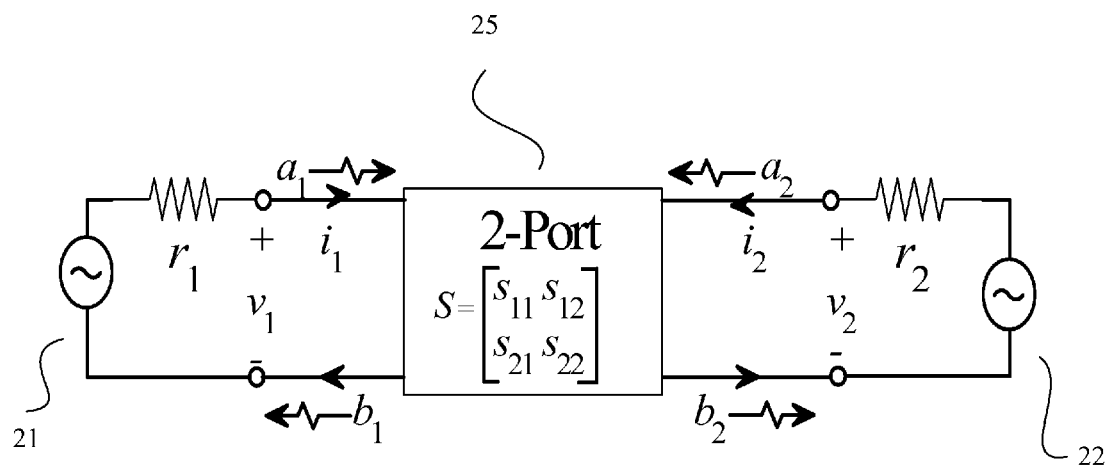
FIG. 2 shows an illustration of a 2-port device with voltage sources according to an embodiment of this disclosure.

FIG. 2 is a schematic illustration 20 of a 2-port device 25 with voltage sources 21 and 22 driving each port. An N-port is the collection of voltage v and current i vectors that can appear on its ports. If each port is connected to a voltage source and series resistor $r_n$, the claim is that any linear, time-invariant, solvable N-port is characterized by its N×N scattering matrix. Specializing to the 2-port in FIG. 2, let v and i denote the voltage and current vectors, respectively:

$$v = \begin{bmatrix} v_1 \\ v_2 \end{bmatrix}, \quad i = \begin{bmatrix} i_1 \\ i_2 \end{bmatrix}.$$

Define the incident signal "a" as $$a = \frac{1}{2} \{R_0^{-1/2} v + R_0^{+1/2} i\}, \quad (1)$$

the reflected signal "b" as $$b = \frac{1}{2} \{R_0^{-1/2} v - R_0^{+1/2} i\}, \quad (2)$$

with respect to the normalizing matrix $$R_0 = \begin{bmatrix} r_1 & 0 \\ 0 & r_2 \end{bmatrix}.$$

The scattering matrix shown below is defined as the matrix that maps the incident signal to the reflected signal:

$$b = \begin{bmatrix} b_1 \\ b_1 \end{bmatrix} = \begin{bmatrix} S_{11} & S_{12} \\ S_{21} & S_{22} \end{bmatrix} \begin{bmatrix} a_1 \\ a_2 \end{bmatrix} = Sa.$$

The scattering matrix determines the power P consumed by the N-port at frequency $\omega$:

$$P(j\omega) = a(j\omega)^H \{I_N - S(j\omega)^H S(j\omega)\} a(j\omega)^H.$$

The N-ports can be classified by their power consumption:
Non-reactive: $S^H(j\omega)S(j\omega) \leq I_N$ for all $\omega$ in R.
Lossless: $S^H(j\omega)S(j\omega) = I_N$ for all $\omega$ in R
Active: $S^H(j\omega)S(j\omega) > I_N$ for some $\omega$ in R.

If an N-port contains only the lumped, lossless elements (inductors and capacitors), the scattering matrix S(p) is a lossless rational function. The matching N-ports are typically lossless. If the N-port contains resistors, S(p) is a non-reactive rational function. Non-reactive N-ports can stabilize amplifiers by trading gain for noise although this practice is not recommended. Instead, feedback topologies provide an acceptable stability margin with lossless matching.

The Amplifier Functions

Figure 3:
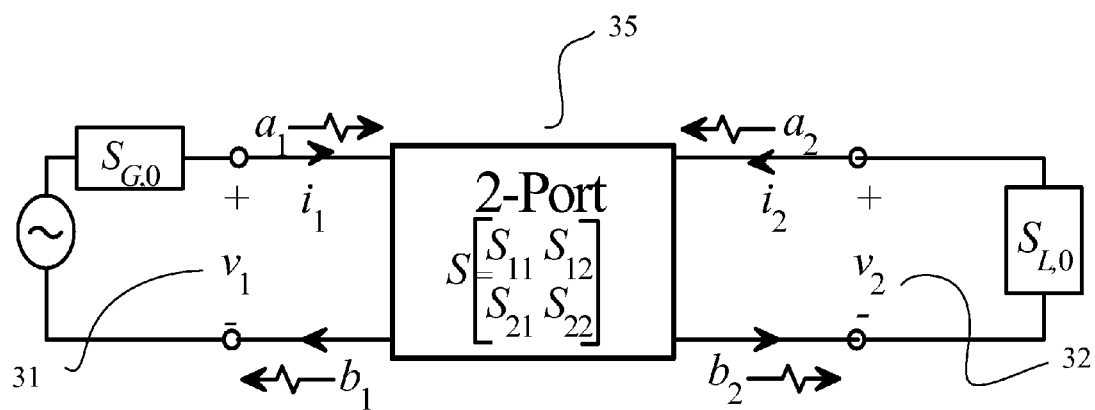
FIG. 3 shows an illustration of the general setup for a non-reactive multiport with "unknown" amplifier functions.

FIG. 3 is a schematic illustration 30 of the general setup for a non-reactive multiport 35 with "unknown" amplifier functions. A 2-port, either non-reactive or active, delivers the signal entering Port 1 (31) to the load $S_{L,O}$ that terminates Port 2 (32). The following amplifier functions can now be defined in terms of the 2-port's scattering matrix S(p).

The Stability Functions $S_1$ denotes the reflectance looking into Port 1 (31) with Port 2 (32) terminated in the load's reflectance $S_{L,0}$ and is $$S_1 = S_{11} + S_{12} S_{L,0} (1 - S_{22} S_{L,0})^{-1} S_{21} \quad (3)$$

As a function of the scattering matrix S and frequency $\omega$, $S_1$ can be written as $$S_1(S; j\omega) = S_{11}(j\omega) + S_{12}(j\omega) S_{L,0}(j\omega)(1 - S_{22}(j\omega) S_{L,0}(j\omega))^{-1} S_{21}(j\omega).$$

The worst loss of stability at Port 1 (31) for any frequency is $$\|S_1(S)\|_\infty := \sup\{|S_1(S;j\omega)| : \omega \in R\}.$$

The reflectance looking into Port 2 (32) with Port 1 (31) terminated in $S_{G,0}$ is $$S_2 = S_{22} + S_{21} S_{g,0} (1 - S_{11} S_{G,0})^{-1} S_{12}. \quad (4)$$

The worst loss of stability at Port 2 (32) for any frequency is $$\|S_2(S)\|_\infty := \sup\{|S_2(S;j\omega)| : \omega \in R\}.$$

When either $\|S_1\|_\infty > 1$ or $\|S_2\|_\infty > 1$, oscillations arise and the resulting circuit is not stable.

The Transducer Power Gain

The transducer power gain $G_T$ is the ratio of the power dissipated in the load to the maximum power available from the source:

$$G_T = |S_{21}|^2 \frac{(1-|S_{G,0}|^2)(1-|S_{L,0}|^2)}{|(1-S_{11}S_{G,0})(1-S_{22}S_{L,0}) - S_{12}S_{21}S_{G,0}|^2}. \quad (5)$$

The "worst" or smallest transducer power gain for any frequency is $$\|G_T(S)\|_\infty := \inf\{G_T(S;j\omega) | : \omega \in R\}.$$

Noise Figure

When a signal and the associated input noise are amplified by a noiseless 2-port, the input $SNR(S_i/N_i)$ is the same as the output $SNR(S_o/N_o)$. A noisy 2-port adds noise that decreases the output SNR. The noise figure F measures this degradation:

$$F = \frac{S_i/N_i}{S_o/N_o} \geq 1.$$

Figure 4:
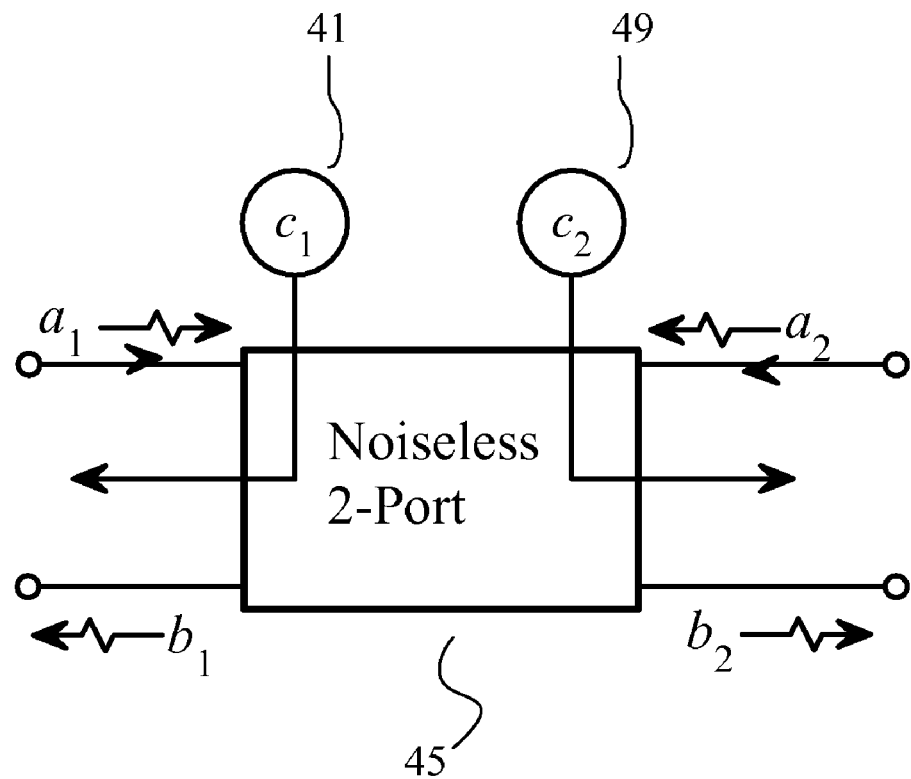
FIG. 4 shows an illustration of a noisy 2-port modeled with a noiseless 2-port and two noise waves.

FIG. 4 is an illustration 40 of how a noisy 2-port is modeled using a noiseless 2-port 45 and two noise waves $c_1$ (41) and $c_2$ (49) emanating from Ports 1 and 2, respectively. If the noiseless 2-port 45 has scattering matrix S, then $$b = \begin{bmatrix} b_1 \\ b_1 \end{bmatrix} = \begin{bmatrix} S_{11} & S_{12} \\ S_{21} & S_{22} \end{bmatrix} \begin{bmatrix} a_1 \\ a_2 \end{bmatrix} + \begin{bmatrix} c_1 \\ c_2 \end{bmatrix} = Sa + c.$$

The noise waves $c_1$ and $c_2$ that constitute the noise vector c can be zero-mean, wide-sense stationary random processes with noise correlation matrix $$C_S = E[cc^H]; \quad \text{for } c = \begin{bmatrix} c_1 \\ c_2 \end{bmatrix}, \quad (6)$$

where "E" denotes the expectation operator. The noise figure for the overall 2-port is $$F(S) = 1 + \frac{\alpha^H C_S \alpha}{k_B T_0 (1-|S_{G,0}|^2)}, \quad (7)$$

where $k_B = 1.380 \times 10^{-23}$ J/K is Boltzmann's constant, $T_0 = 290$ Kelvins is the standard temperature, and $\alpha$ denotes the vector $$\alpha = \begin{bmatrix} S_{G,0} \\ (1 - S_{G,0} S_{11})/S_{21} \end{bmatrix}. \quad (8)$$

The worst noise figure at any frequency is $$\|F(S)\|_\infty := \sup\{|F(S;j\omega)| : \omega \in R\}.$$

State-Space Representation of the Non-Reactive Multiport

From the above introductory groundwork, the amplifier functions can now be determined by the lumped network, which admits a numerically efficient parameterization by the state-space representation. A description of attaching the amplifiers to this state-space representation is presented in the next section. This section presents several examples implementing the exemplary methods and systems are described.

It should be appreciated that the resulting state-space representation provides a numerically efficient parameterization of the amplifier functions over all the lumped networks. Consequently, the application of this parameterization to the multiple amplifier matching enables the efficient and quick design of amplifier systems in an arbitrary topology containing not only amplifiers but also lumped, non-reactive devices. The scheme for parameterization is generalized into a "State Space Lumped Amplifier Matching" (SSLAM) algorithm which encompasses both lossless and non-reactive matching over all circuit topologies including all feedback topologies.

Figure 5:
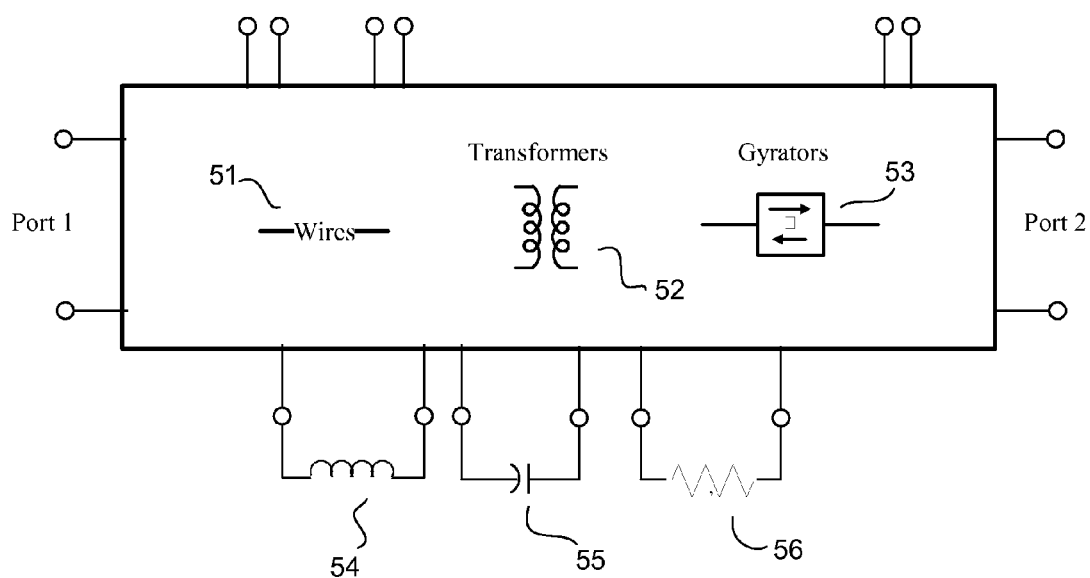
FIG. 5 shows an illustration of the state-space representation of a lumped, non-reactive N-port.

FIG. 5 is a general illustration 50 of a lumped, non-reactive N-port containing:

Non-reactive elements: wires 51, transformers 52, gyrators 53;

Lumped reactive elements: inductors 54 and capacitors 55;

Dissipative elements: resistors 56.

The state-space representation is obtained by grouping the inductors 54, capacitors 55, and resistors 56 into the augmented load (see FIG. 1) with scattering matrix $$S_L(p) = \begin{bmatrix} qI_{N_I} & 0 & 0 \\ 0 & -qI_{N_C} & 0 \\ 0 & 0 & 0_{N_R} \end{bmatrix},$$

where $q=(p-1)/(p+1)$. By grouping the lumped reactive and dissipative elements into the load, what is left is a non-reactive multiport containing only wires 51, transformers 52, and gyrators 53. This non-reactive multiport has a corresponding scattering matrix $S_a$ that is real, lossless, and constant, and is coupled to the augmented load scattering matrix $S_L(p)$ having the form above. It is understood that the scattering matrix $S_a$ representation is an orthogonal matrix that can be partitioned. We can partition this scattering matrix of the non-reactive multiport as $$S_a = \begin{bmatrix} S_{a,11} & S_{a,12} \\ S_{a,21} & S_{a,22} \end{bmatrix},$$

where $S_{a,11}$ is a real 2×2 matrix, $S_{a,22}$ is a real d'×d' matrix, where $d'=N_L+N_C+N_R$. Then the network scattering matrix $S(p)$ for the overall lumped, non-reactive N-port admits the following state-space representation:

$$S(p) = S_{a,11} + S_{a,12} S_L(P) \{I_{d'} - S_{a,22} S_L(p)\}^{-1} S_{a,21}. \quad (9)$$

An interesting result is that will be exploited is that the converse is true: Every rational function S(p) determined by Equation 9 corresponds to a lumped, non-reactive N-port.

State-Space Representation of the Active Multiport

Based on the above, if amplifiers are attached to the N-port as shown, for example, in FIG. 1, Equation 9 gives the state-space parameterization of these active circuits. Specifically, the state-space representation for the active circuit of FIG. 1 can be obtained by grouping the inductors 13a, capacitors 13b, resistors 17, and amplifiers 15 into the augmented load with scattering matrix $$S_L(p) = \begin{bmatrix} qI_{N_L} & 0 & 0 & 0 & \cdots \\ 0 & -qI_{N_C} & 0 & 0 & \cdots \\ 0 & 0 & 0_{N_R} & 0 & \cdots \\ 0 & 0 & 0 & S_{amp}(p) & \cdots \\ \vdots & \vdots & \vdots & \vdots & \ddots \end{bmatrix}, \quad (10)$$

where q(p−1)/(p+1). The remaining non-reactive multiport contains only wires 14, transformers 16, and gyrators 18 so its corresponding scattering matrix $S_a$ is orthogonal, real, lossless, and constant. Next, to transform, the non-reactive multiport to an active circuit, we number and map the ports as follows: Ports 1 and 2 are the input and output, respectively; the next $N_L$ ports are where the inductors attach; the next $N_C$ ports attach the capacitors; the next $N_R$ ports attach the resistors; the remaining $2N_A$ ports are where the amplifiers attach. Using this numbering scheme, we can partition the scattering matrix from the non-reactive multiport as $$S_a = \begin{bmatrix} S_{a,11} & S_{a,12} \\ S_{a,21} & S_{a,22} \end{bmatrix}, \quad (11)$$

where $S_{a,11}$ is a real 2×2 matrix, $S_{a,22}$ is a real d×d' matrix where d'−$N_L$+$N_C$+$N_R$+$2N_A$. Then the scattering matrix S(p) for the active circuit admits the following state-space representation:

$$S(p) = S_{a,11} + S_{a,12}S_L(p)\{I_{d'} - S_{a,22}S_L(p)\}^{-1}S_{a,21}. \quad (12)$$

This expression can be understood as the overall state-space representation of the active circuit, having terms from the scattering matrix $S_a$ (arising from the non-reactive multiport) and scattering matrix $S_L(p)$ augmented load array.

Let $A(N_L, N_C, N_R, N_A)$ denote the collection of the scattering matrices of the active circuits parameterized by Equation 12. This state-space representation also calculates the noise figure where both the amplifiers and resistors are noise sources. These noise sources contribute to the noise correlation matrix $C_S$ of Equation 7 as follows:

$$C_S = \Lambda C_L \Lambda^H, \quad (13)$$

where $$\Lambda(p) = S_{a,12} + S_{a,12}S_L(p)\{I_{d'} - S_{a,22}S_L(p)\}^{-1}S_{a,22}.$$

and $C_L$ denotes the noise covariance matrix of the augmented load $$C_L(p) = \begin{bmatrix} 0_{N_L} & 0 & 0 & 0 & \cdots \\ 0 & 0_{N_C} & 0 & 0 & \cdots \\ 0 & 0 & k_B T_0 I_{N_R} & 0 & \cdots \\ 0 & 0 & 0 & C_{amp}(p) & \cdots \\ \vdots & \vdots & \vdots & \vdots & \ddots \end{bmatrix},$$

where there are $N_A$ copies of the noise covariance matrix $C_{amp}(p)$ of the amplifier strung along the diagonal.

Applying now the above principles to the problem of FIG. 1, we find a lumped network containing $N_L$ inductors, $N_C$ capacitors, $N_R$ resistors so that when $N_A$ user-specified amplifiers are attached, the resulting active circuits have a scattering matrix S(p) that simultaneously:

Maximizes the transducer power gain $\|G_T(S)\|_{-\infty}$,
Minimizes the noise figure $\|F(S)\|_\infty$, and
Minimizes the stability functions $\|S_1(S)\|_\infty \leq 1$ and $\|S_2(S)\|_\infty \leq 1$.

$S_1$, $S_2$, and $G_T$ are given by Equations 3, 4, and 5. F(S) is computed from Equation 7 supported by Equations 8 and 13. The scattering matrices S(p) reside in the set $A(N_L, N_C, N_R, N_A)$ determined by Equation 12.

Mathematically, the solution to Equation 12 can be obtained from a multi-objective optimization approach, such as $$\min\{\gamma(S): S \in A(N_L, N_C, N_R, N_A)\}, \quad (14)$$

where the multi-objective amplifier function is $$\gamma(S) = \begin{bmatrix} -\|G_T(S)\|_{-\infty} \\ \|F(S)\|_\infty \\ \|S_1(S)\|_\infty \\ \|S_2(S)\|_\infty \end{bmatrix}. \quad (15)$$

A solution to Equation 14 bounds the performance of the amplifier matching problem. The following section describes one of several possible embodiments for minimizing Equation 14.

State-Space Lumped Amplifier Matching (SSLAM) Minimization

Let $A(N_L, N_C, N_R, N_A)$ denote the collection of the scattering matrices of the active circuits admitting the state-space representation of Equation 12:

$$S(p) = S_{a,11} + S_{a,12}S_L(p)\{I_{d'} - S_{a,22}S_L(p)\}^{-1}S_{a,21}.$$

With the augmented load $S_L(p)$ fixed by Equation 10, only the scattering matrix $S_a$ is needed to parameterize these scattering matrices of $A(N_L, N_C, N_R, N_A)$. A matrix is said to be skew-symmetric provided $\Theta = -\Theta^T$. The π-section of the real skew-symmetric matrices is denoted as Skew $[2+d', \pi] = \{\Theta \in R^{(2+d') \times (2+d')}: \Theta = -\Theta^T$ and $|\Theta(m_1, m_2)| \leq \pi\}$.

We can parameterize the matrices $S_a$ by an exponential map defined on the skew-symmetric matrices as follows:

$$\exp(\Theta) = \sum_{n=0}^{\infty} \frac{\Theta^n}{n!} = \begin{bmatrix} S_{a,11} & S_{a,12} \\ S_{a,21} & S_{a,22} \end{bmatrix} = S_a,$$

where $S_{a,11}$ is a real 2×2 matrix, $S_{a,22}$ is a real d'×d' matrix. The State-Space parameterization of the active multiports $A(N_L, N_C, N_R, N_A, S_{amp})$ consists of the two mappings $\mathscr{T}_+(\Theta)$ and $\mathscr{T}_-(\Theta)$ from the skew-symmetric matrices to the active circuits:

$$\mathscr{T}_\pm(\Theta;p) = \sigma_\pm S_{a,11} + S_{a,12} S_L(p) \{I_d - S_{a,22} S_L(p)\}^{-1} S_{a,21},$$

where $\sigma_\pm$ are the signed matrices:

$$\sigma_\pm = \begin{bmatrix} 1 & 0 \\ 0 & \pm 1 \end{bmatrix}.$$

With respect to this parameterization, the multi-objective amplifier function of Equation 15 splits into the forms:

$$\gamma_\pm(\Theta) = \begin{bmatrix} -\|G_T(F_\pm(\Theta))\|_{-\infty} \\ \|F(F_\pm(\Theta))\|_\infty \\ \|S_1(F_\pm(\Theta))\|_\infty \\ \|S_1(F_\pm(\Theta))\|_\infty \end{bmatrix}. \qquad (16)$$

Consequently, the multi-objective optimization problem of Equation 14 splits into two forms min $\{\gamma_\pm(\Theta): \Theta \in \text{Skew } [2+d', \pi]\}$. Such vector-valued minimization problems typically admit an infinite number of minimizers depending on the amplifier designers' approach.

In addition to the exponential mapping described above, we can apply alternate parameterization schemes if we presume the orthogonal group $O[N]$ is a set that consists of all real $N \times N$ matrices $S$ that satisfy the orthogonality condition: $S^T S = I_N$, where the superscript "T" denotes the matrix transpose and $I_N$ denotes the $N \times N$ identity matrix. In this discussion, the term $S$ represents the augmented scattering matrices $S_a$. Based on the above condition, an implicit optimization of $\gamma(S)$ over all the real $N \times N$ matrices subject to the orthogonality constraint can be performed. Specifically, this optimization problem turns into a constrained optimization problem:

Minimize $\gamma(S)$, where $S$ is a real $N \times N$ matrix subject to the constraints $S^T S = I_N$.

Another approach is to use a reactive technique which is an explicit parameterization of the orthogonal matrices $O[N]$. The parameterization is based on the observation that $S = (X - I_N)(X + I_N)^{-1}$ is a real $N \times N$ orthogonal matrix provided $X$ is a real $N \times N$ skew-symmetric matrix. Consequently, the optimization of $\gamma(S)$ over $O[N]$ can be cast as:

Minimize $\gamma((X-I_N)(X+I_N)^{-1})$, where $X$ is a real $N \times N$ skew-symmetric matrix.

Another approach that can be applied is a rotational technique. This technique is an explicit parameterization of the orthogonal matrices $O[N]$. The parameterization is based on orthogonal matrices are a product of rotations. For example, the $3 \times 3$ orthogonal matrices may be parameterized by multiplying the following rotations: rotate in the y-z plane, rotate in the x-z plane, and rotate in the x-y plane. Then each $3 \times 3$ orthogonal matrix admits the parameterization $S = R_{yz}(\theta_1) R_{xz}(\theta_2) R_{xy}(\theta_3)$, where each $3 \times 3$ rotation matrix is a function of its angle. Consequently, the optimization of $\gamma(S)$ over $O[3]$ can be cast as:

Minimize $\gamma(R_{yz}(\theta_1) R_{xy}(\theta_2) R_{xy}(\theta_3))$, where $|\theta_1|, |\theta_2|, |\theta_3|, \leq \pi$.

For the general $N \times N$ case, a parameterization can consist the product of all pair-wise coordinate rotations using rotation angles $\theta_1, \ldots, \theta_M$, where $M = N(N-1)/2$. That is, $S = R_1(\theta_1) R_2(\theta_2) \ldots R_M(\theta_M)$ casts the optimization of $\gamma(S)$ over $O[N]$ as:

Minimize $\gamma(R_1(\theta_1) R_2(\theta_2) \ldots R_M(\theta_M))$, where $|\theta_1|, |\theta_2|, \ldots, |\theta_M|, \leq \pi$.

The above examples provide several approaches to parameterization and "solving" the relevant functions that an amplifier designer may implement.

Figure 6:
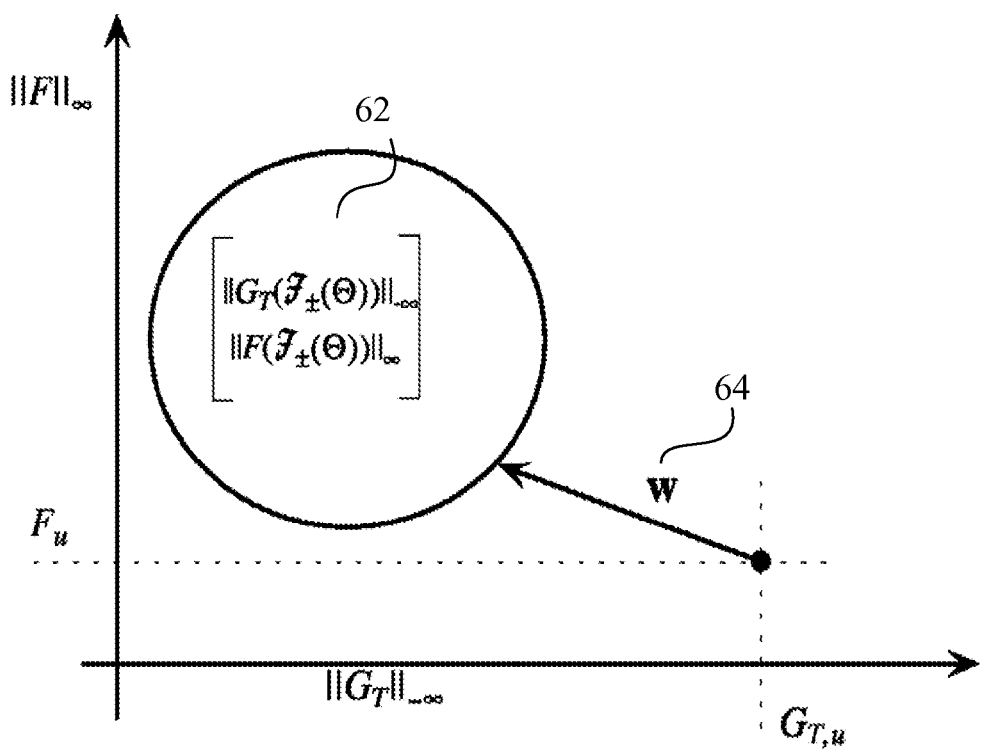
FIG. 6 shows a plot illustrating the relationships between minimization vectors.

The amplifier designer wants to find a multiport that gets "as close as possible" to the user's desired gain $G_{T,u}$ and noise figure $F_u$. FIG. 6 provides a sample plot 60 illustrating the relationships between these vectors. For clarity, the plot of FIG. 6 suppresses the stability functions and we only discuss the gain (G) and noise (F). The interior region 62 represents the available gain-noise performance. This region is typically unknown to the amplifier designer although a massive sampling can reveal its gross structure. The amplifier designer should select a weight vector 64

$$w = \begin{bmatrix} w_G \\ w_F \end{bmatrix}.$$

A desire is to find the amplifier that is closest or closer to $G_{T,u}$ and $F_u$, in the direction of the weight vector 64. One method is to start from t=0 and increase t>0 until the vector $$\begin{bmatrix} G_{T,u} \\ F_u \end{bmatrix} + t \begin{bmatrix} w_G \\ w_F \end{bmatrix}$$

just touches the outer edge of the interior region 62. The point of contact is called a Pareto minimum. Changing the weight vector w produces another Pareto minimum. In terms of the full $\gamma_\pm$ multi-objective functions, the optimization problem is to minimize $\{t>0\}$ subject to the vector inequality constraints $$\gamma_\pm(\Theta) - tw \leq \gamma_{\pm u},$$

for $\Theta$ in Skew $[d'+2, \pi]$. The stability constraints are enforced by taking the weight vector 64 as $$w = \begin{bmatrix} w_G \\ w_F \\ 0 \\ 0 \end{bmatrix}.$$

SSLAM Algorithm Implementation

A high-level implementation for estimating matching performance available from the lumped multiports (using the schematic of FIG. 1) is now described. The high level implementation will be referred to as the SSLAM algorithm and is instructive for providing to the designer the optimal bounds of the performance of $N_A$ user-specified amplifiers connected to any lumped network containing $N_L$ inductors, $N_C$ capacitors, and $N_R$ resistors. A preliminary definition of parameters and, preferably, but not necessarily limited, ranges for the SSLAM algorithm are:

Data:
The sample frequencies $\Omega = \{\omega_n: n=1, \ldots N_\Omega\}$.
The reflectance of the generator at the sample frequencies $S_{G,0}(j\omega_n)$.
The reflectance of the load at the sample frequencies $S_{L,0}(j\omega_n)$.
The scattering function of the user-selected amplifier $S_{amp}(j\omega_n)$.

The noise covariance matrix $C_{amp}(j\omega_n)$ of the amplifier.

User Input:

The number of inductors $N_L$, capacitors $N_C$, resistors $N_R$, and amplifiers $N_A$.

The stability bounds $S_{1,u}, S_{2,u} \leq 1$.

The gain and noise design goals $G_{T,u}$ and $F_u$.

The gain and noise weights $w_G$ and $w_F$.

Computation:

An important consideration is if the stability bounds are feasible: Find any $\Theta$ in skew $[d'+2,\pi]$ such that $$\gamma_\pm(\Theta) \leq \begin{bmatrix} -1 \\ 10 \\ S_{1,u} \\ S_{2,u} \end{bmatrix}.$$

If the stability bounds are feasible, then we can set the user's design goal and weight vectors as $$\gamma_{\pm,u} = \begin{bmatrix} G_{T,u} \\ F_u \\ S_{1,u} \\ S_{2,u} \end{bmatrix}, \quad w = \begin{bmatrix} w_G \\ w_F \\ 0 \\ 0 \end{bmatrix}.$$

The zeros in the weight vector force the stability constraints. Starting from the feasible point that is closest to $\gamma_{\pm,u}$, minimize $\{t \geq 0\}$ subject to the constraints $\gamma_\pm(\Theta) - tw \leq \gamma_{\pm,u}$ for $\Theta$ in Skew $[d'+2, \pi]$.

Outputs:

If $\Theta_{\pm,opt}$ denotes the corresponding minimizers, report the amplifier performance as $\gamma_\pm(N_L, N_C, N_R, N_A) = \gamma_\pm(\Theta_{\pm,opt})$.

It should be noted that while the above steps were described in the context of Skew matrices, parameterization steps using the orthogonal group O[N] orthogonality condition, as described above, may be used without departing from the spirit and scope of this disclosure.

Figure 7:
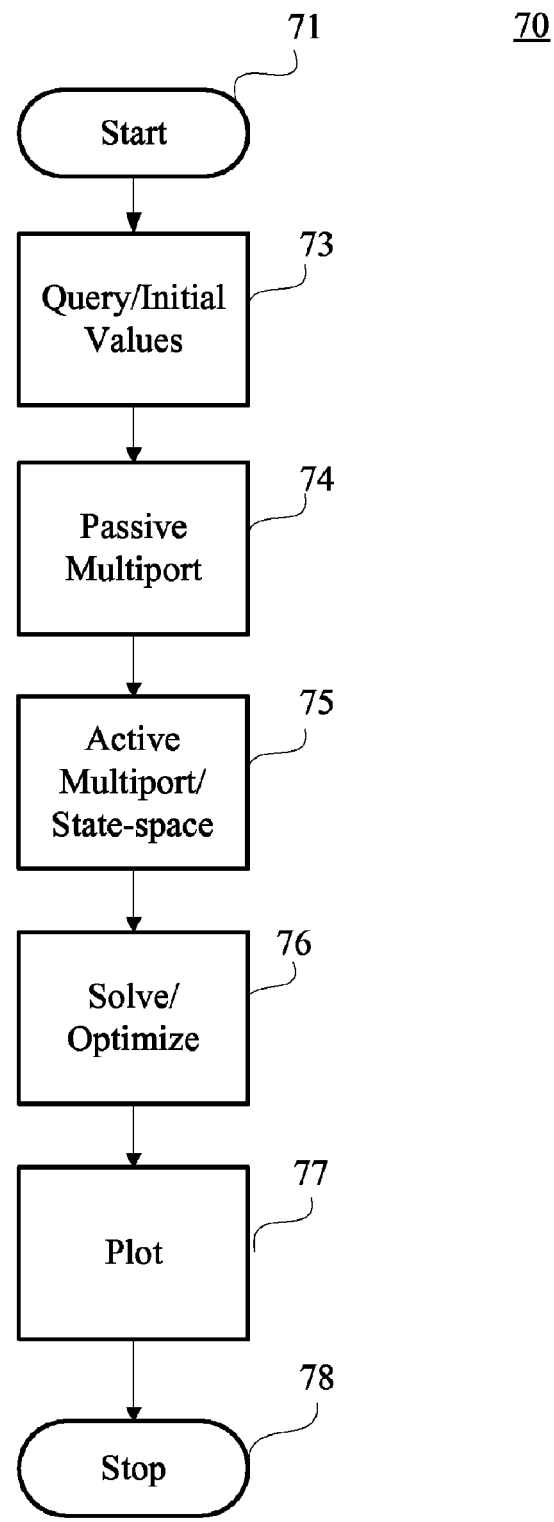
FIG. 7 shows a flow chart illustrating exemplary processes for the SSLAM algorithm.

FIG. 7 is a flow chart illustrating an exemplary process 70 for the SSLAM algorithm. The steps illustrated in the exemplary process 70 can be used to design an amplifier circuit. The exemplary process 70 begins with initiation 71 and proceeds to an input of values 73 for the circuit under design that may be acquired by querying the user or reading in a configuration data file or list. The entered or inputted data may be optionally calibrated or error-checked according to design preference. The input values 73 correspond primarily, but are not limited to, information on the desired amplifier(s) and circuit parameters. For example, the input values 73 may encompass information such as the data frequencies, reflectance, scattering function and noise covariance matrix for the desired amplifier(s), as well as characteristics for non-amplifier elements in the circuit. The input values 73 may also include user-provided information, such as design goals or constraints. Such goals or constraints may encompass the number of inductors, capacitors, resistors, and amplifiers. Additionally, information such as, for example, stability bounds, gain and noise, and weighting factors may be acquired at this stage 73 of the exemplary process 70. It should be appreciated that in some embodiments, portions of or the entirety of the input data parameters/values can be provided upon the initial startup stage 71 of the exemplary process 70 or in later stages, according to design preference. Data input and initial value methodologies are well known in the art and are therefore not detailed herein.

From the input of values 73, process 70 proceeds to generating a non-reactive multiport representation 74 of the circuit under design using an augmented load, based on information from the values input at step 73 and/or step 71. The non-reactive multiport representation 74 may take the form of a scattering matrix, or other network-parameter matrix, or other state-space representation. In some embodiments it may be possible to generate a non-reactive multiport representation 74 without actually having all of the input values 73, by using general expressions or variables which may later be replaced by the actual later-input values 73. Accordingly, depending on design preference, portions of or the entirety of the step of inputting values 73 may be deferred to after the non-reactive multiport representation 74 has been accomplished.

After the non-reactive multiport representation 74 is generated, state-space representation 75 is performed by first attaching the ports of the augmented non-reactive multiport with active, reactive and resistive elements of the circuit under design in an ordered manner. The overall circuit response can then be cast into the state-space representation 75 using matrices of the non-reactive multiport and the augmented load. The state-space representation 75 can be used to formulate a set of matrices that describe the performance of the circuit under design. The state-space representation 75 shown herein is formulated in terms of network S-parameters, however, other network-parameters may be used according to design implementation.

From the state-space representation 75, an optimal state-space solution set is subsequently determined by executing an optimization routine 76. A suitable optimization routine is presented in this disclosure. It should be noted, that alternative optimization routines may be utilized, if so desired. These solution sets may be constrained by parameters or values designated in step 73 or anywhere in the exemplary process 70.

From the set of solutions generated from the optimization 76, the exemplary process 70 may optionally generate a plot or map 77 relating the input values/circuit parameters to the performance of the circuit. Specifically, the topology of the circuit may be evaluated as an adjustable parameter. Also, for example, a noise or performance profile of the circuit under design may be presented. From the plot of this data, the designer can acquire information on how to modify the parameters or design to affect the performance of the circuit. In some embodiments, it may be desirable to calculate a maximum or minimum threshold of noise/performance, whereas a plotting of the values is not necessitated, since a maximum or minimum need only be found. However, in some other embodiments, it may be desirable for trending information, for example, to be rendered, thus a plot 77 of the results of the solution/optimization 76 may be performed. Process 70 may then proceed from either of step 76 or 77 to termination 78.

Method 70 may be implemented using a programmable device, such as a computer-based system. Method 70 may be implemented using various programming languages, such as "C", "C++", "FORTRAN", Pascal", and "VHDL".

Various computer-readable storage mediums, such as magnetic computer disks, optical disks, and electronic memories, may be prepared that may contain instructions such that direct a device, such as a computer-based system, may implement the steps of method 70. Once an appropriate device has access to the instructions contained on the computer-readable storage medium, the computer-readable storage medium may provide the information and programs to the device, enabling the device to perform method 30.

As an example, if a computer disk containing appropriate materials, such as a source file, an object file, or an executable file, were provided to a computer, the computer could receive the information, appropriately configure itself and perform the steps of method 70. The computer could receive various portions of information from the disk relating to different steps of method 30, implement the individual steps, and coordinate the functions of the individual steps.

Method 70 may also be implemented by a system having a display, a processor operatively connected to the display, and a memory module operatively connected to the processor. The memory module may have program instructions stored therein, wherein the program instructions are executable by the processor to perform method 70. Method 70 may result in output, such as amplifier performance criteria for various amplifier circuit topologies, being displayed to a user of the system via the display.

Figure 8:
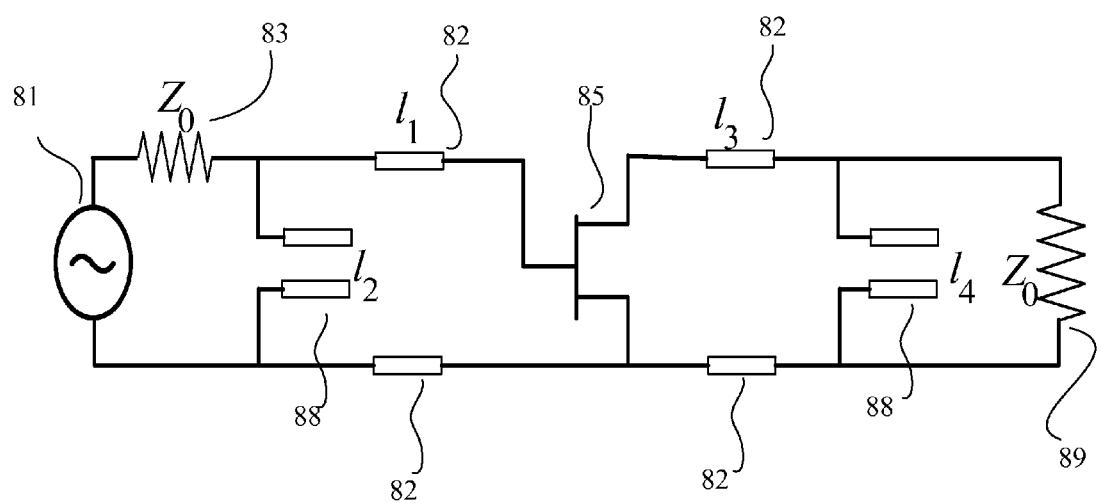
FIG. 8 shows a schematic illustration of a wideband transistor circuit having a cascade configuration suitable for implementation of the SSLAM algorithm.
Figure 9:
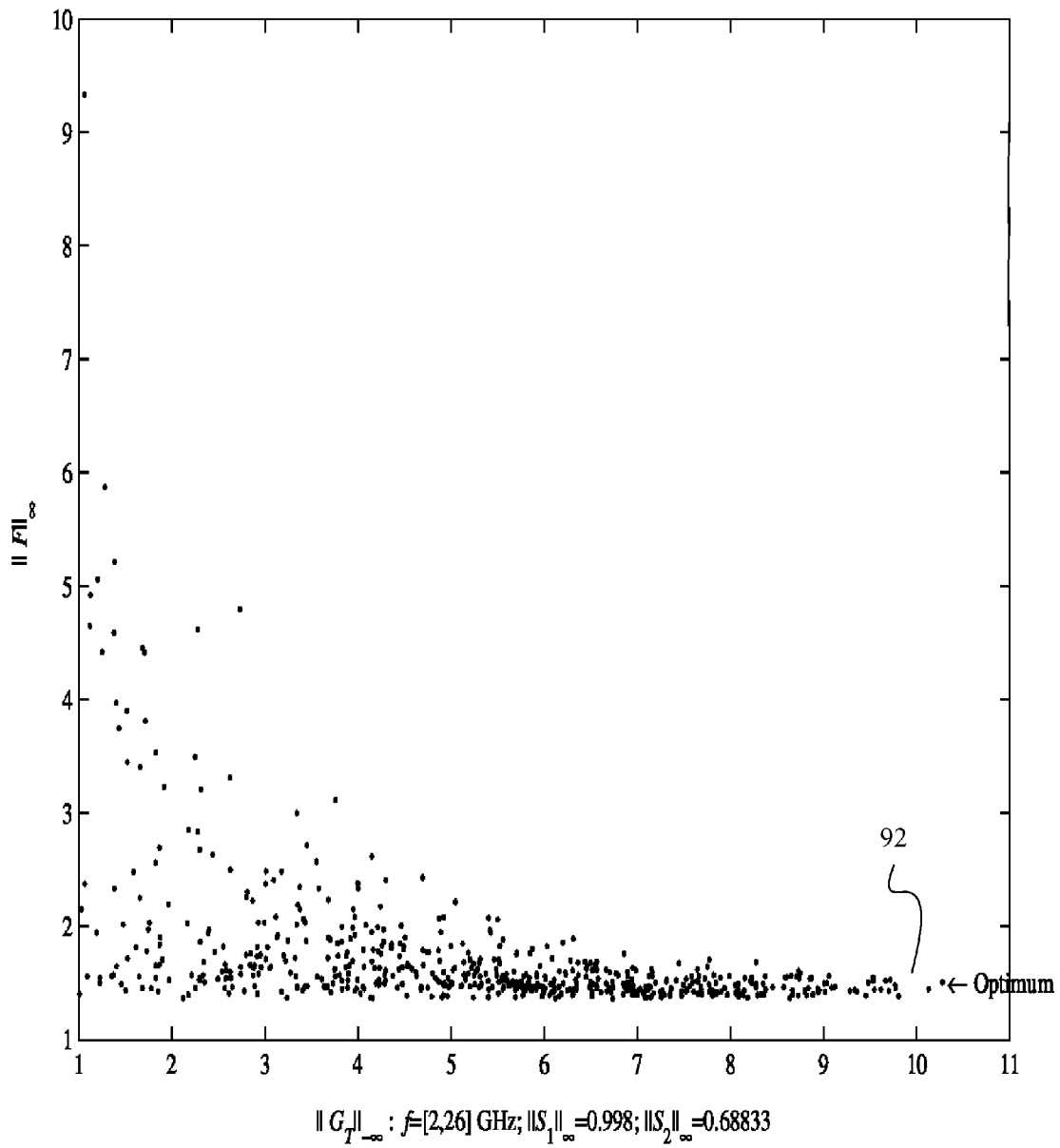
FIG. 9 shows a data plot showing the performance of the amplifier circuit of FIG. 8 against the performance available from all lumped networks for the same FET.

FIG. 8 is a schematic illustration 80 of a series-shunt, stub cascade topology, single, low-noise hetero-junction field effect transistor 85 (FET) NE321000 amplifier circuit, having series 82 and shunt 88 line lengths $l_1$, $l_2$, and $l_3$, $l_4$, respectively. The circuit is couple to a source 87, source load $Z_0$ 83 and load 89, having a fixed topology. FIG. 9 is a data plot 90 over 2-26 GHz of the performance of the amplifier circuit of FIG. 8 against the performance available from all lumped, lossless matching multiports for the same FET. The optimal lengths are reported in millimeters and wavelength λ at 10 GHz. The dots mark the gain-noise performance for a random selection of line lengths. The dot labeled "optimum" 92 marks the result of applying a multi-objective optimizer to the line lengths of the cascade.

FIG. 9 reveals some performance limits of the circuit of FIG. 8. Specifically, there is a clear noise floor. Also, there is a "pinching off" as the optimal performance is approached. Further, input stability is nearly violated at the optimum.

Figure 10:
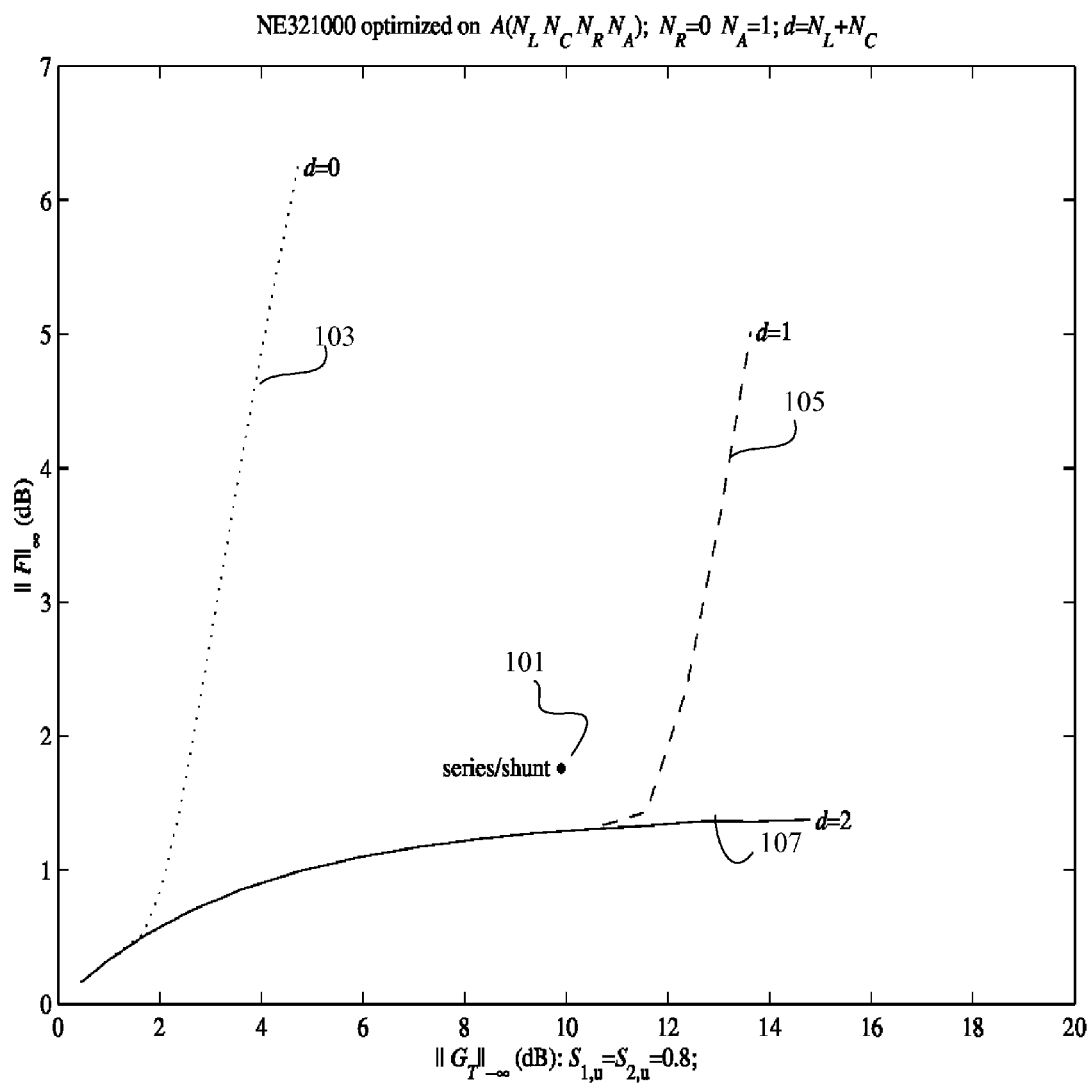
FIG. 10 shows a plot of the gain and noise performance response using lumped networks of arbitrary topology with stability constraints $S_{1,u} = S_{2,u} = 0.8$.

FIG. 10 is a plot 100 of the gain and noise performance response for the NE321000 FET over 2-26 GHz using lumped, lossless matching multiports of arbitrary topology with stability constraints $S_{1,u} = S_{2,u} = 0.8$. The data values in FIG. 10 address the questions postulated above, by comparing the performance of the fixed topology circuit of FIG. 8 against the lumped, lossless matching multiports with arbitrary topology using the SSLAM algorithm. Specifically, the bullet mark 101 marks the performance of the series/shunt cascade network 80 described in FIG. 8 (the series/shunt cascade has no stability margin, that is, $\|S_1\|_\infty = 1$). The curves 103 (dotted), 105 (dashed), and 107 (solid) mark the performance of the general matching multiports according to degrees d, where d is the total number of inductors and capacitors of the multiports: $d = N_L + N_C$, where no resistors are used (e.g., $N_R = 0$). The advantage is that an arbitrary topology—including all feedback circuits to enforce the stability margin can be explored. These curves show that as the amplifier designer demands more and more gain, the matching performance starts to fall away: the d=0 circuits fall away at $G_T = 2$ dB; the d=1 circuits fall away at $G_T = 10$ dB.

FIG. 10 informs the amplifier designer that there is a d=1 single element circuit that attains better performance than the 4-element cascade circuit of FIG. 8 and also satisfies the required stability margin. Thus, the amplifier designer is directed to using fewer reactive elements with a feedback circuit topology to enforce stability. This example shows that the SSLAM algorithm offers the amplifier designer a graphical assessment of the performance of a specific matching circuit against the performance available from all the lumped, lossless matching multiports.

Figure 11:
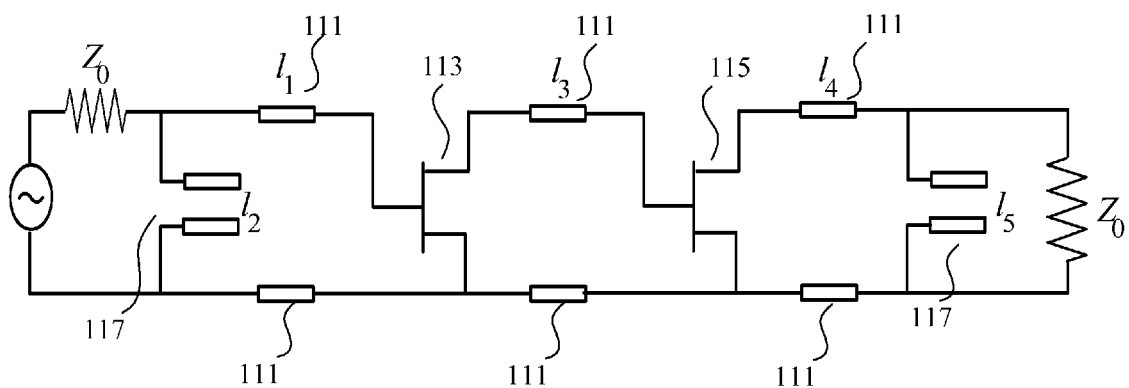
FIG. 11 shows general schematic of a series/shunt cascade matching circuit with two FETs.

FIG. 11 is general schematic 110 of a series/shunt cascade matching circuit with two FETs 113 and 115. The circuit contains two FETs 113,115 that are low-noise heterojunction FET NE321000 amplifiers operating over 2-26 GHz, with series 111 line lengths $l_1$, $l_3$, and $l_4$, and shunt stub 117 lengths $l_2$ and $l_5$.

Figure 12:
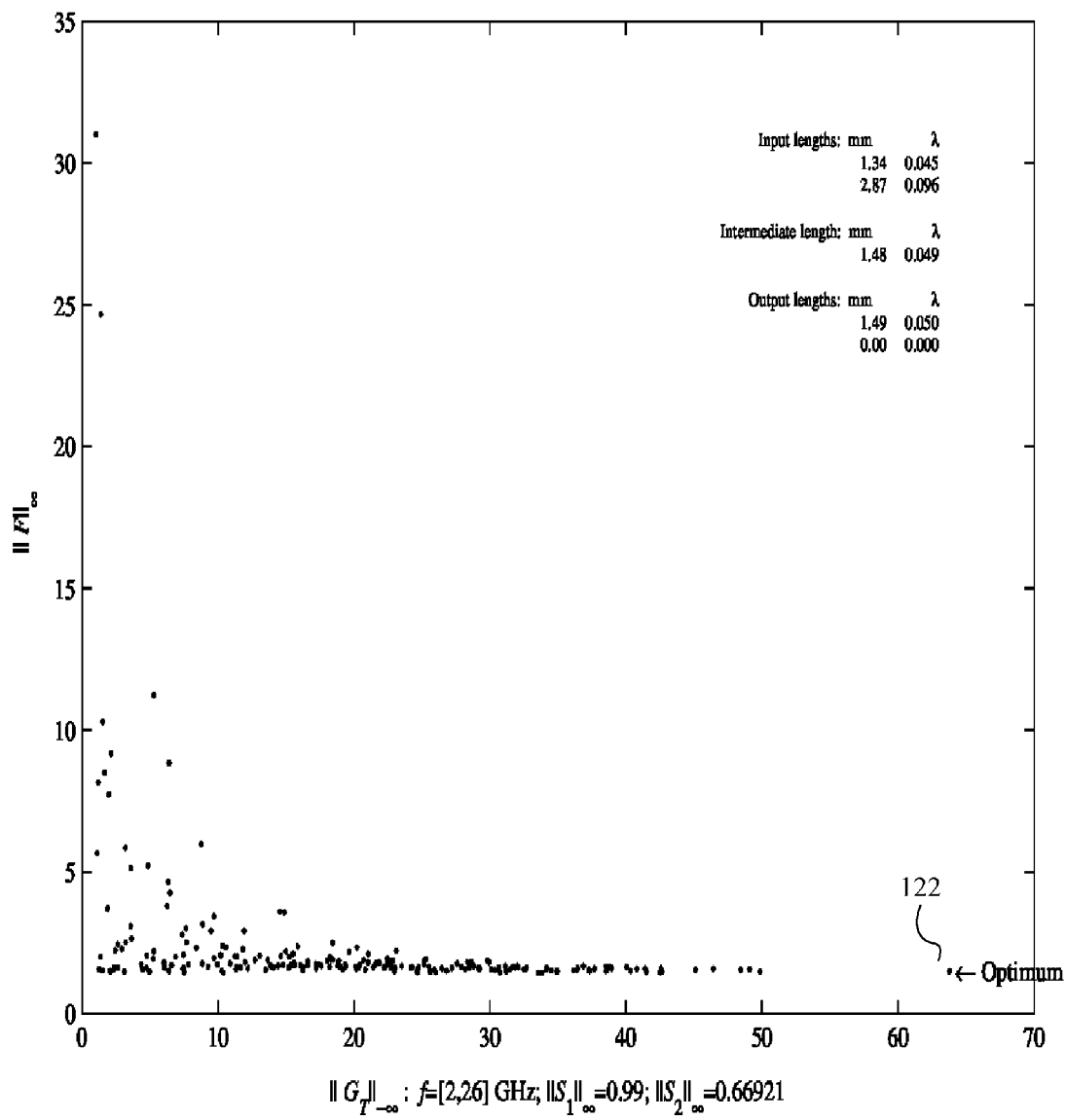
FIG. 12 shows a data plot showing the gain and noise tradeoffs for the circuit of FIG. 11.

FIG. 12 is a data plot 120 showing the gain and noise tradeoffs for the circuit of FIG. 11, over 2-26 GHz. The optimal lengths are reported in millimeters and wavelength λ at 10 GHz. The dots mark the gain-noise performance for random selections of line lengths. The labeled "optimum" 122 at the far right of FIG. 12 marks the result of applying a multi-objective optimizer.

Figure 13:
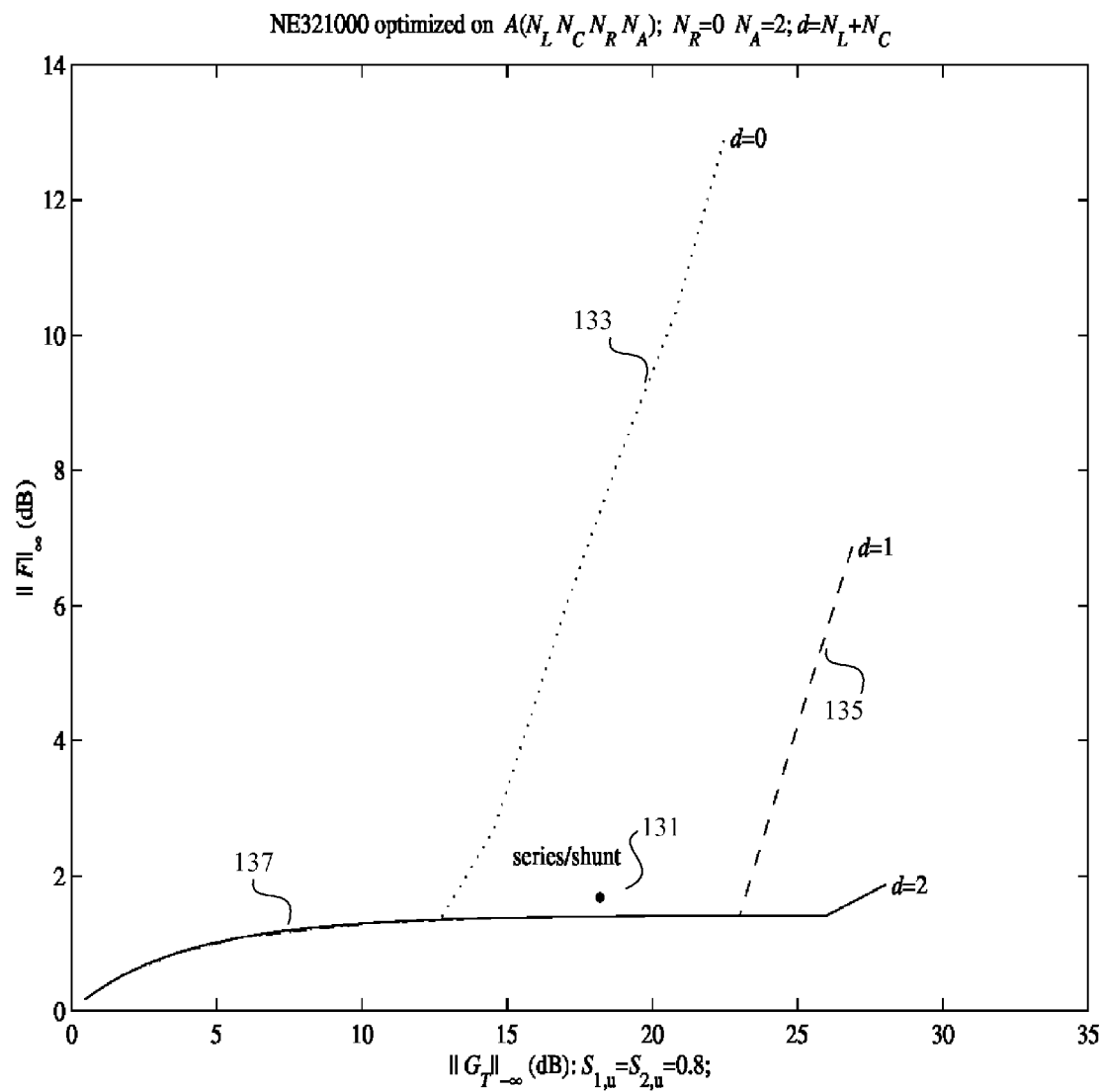
FIG. 13 shows a data plot comparing performance of the circuit of FIG. 11 against the performance available from the lumped networks using the same two FETs with stability constraints $S_{1,u} = S_{2,u} = 0.8$.

FIG. 13 is a data plot 130 comparing performance of the 2-FET circuit 110 of FIG. 11 against the performance available from the lumped, lossless matching multiports using the same two FETs with stability constraints $S_{1,u} = S_{2,u} = 0.8$. The bullet 131 marks the performance of the series/shunt cascade circuit of FIG. 11 (which does not have a stability margin, that is, $\|S_1\|_\infty = 1$). The curves 133 (dotted), 135 (dashed), and 137 (solid) mark the performance of the general matching multiports according to degrees d, where d is the number of reactive elements.

It is apparent from FIG. 13, that as more gain is demanded, the matching performance starts to fall away. This reveals to the amplifier designer is that a d=1 circuit exists with better stability margin, better gain and less noise that the cascade circuit. Correspondingly, the amplifier designer is directed to use fewer reactive elements and explore alternative topologies.

For both the single-stage and two-stage cascade circuits of FIGS. 8 and 11, the SSLAM algorithm showed that low-order lumped, lossless multiports existed that could deliver more gain and less noise while enforcing a stability constraint. In contrast, both cascade circuits were almost unstable.

The SSLAM algorithm also has a numerical advantage because it gives a zero-and pole-free parameterization of $A(N_L, N_C, N_R, N_A)$ using the state-space representation parameterized under the exponential mapping of the compact π-section of the skew-symmetric matrices. In this parameterization, all variables are angles in $[-\pi, \pi]$ and so are numerically "commensurate." There are no physically distinct variables, unbounded regions, no factorizations of polynomials, and no scaling problems. Other mappings, as described above, may be used according to design preference.

While most of the related amplifier CAD programs are device and topology specific, with the high-end programs incorporating detailed models of the biasing circuitry and many parasitic effects, the SSLAM algorithm estimates the performance obtainable from all possible matching multiports of degree d. This performance estimate lets the amplifier designer benchmark the performance of specific candidate multiport. If the candidate multiport shows a performance near the performance computed by the SSLAM algorithm, then the amplifier designer can accept this near-optimal performance. If the performance of the candidate multiport is not close to the performance computed by the SSLAM algorithm, the electrical engineer is motivated to search for other topologies.

Figure 14:
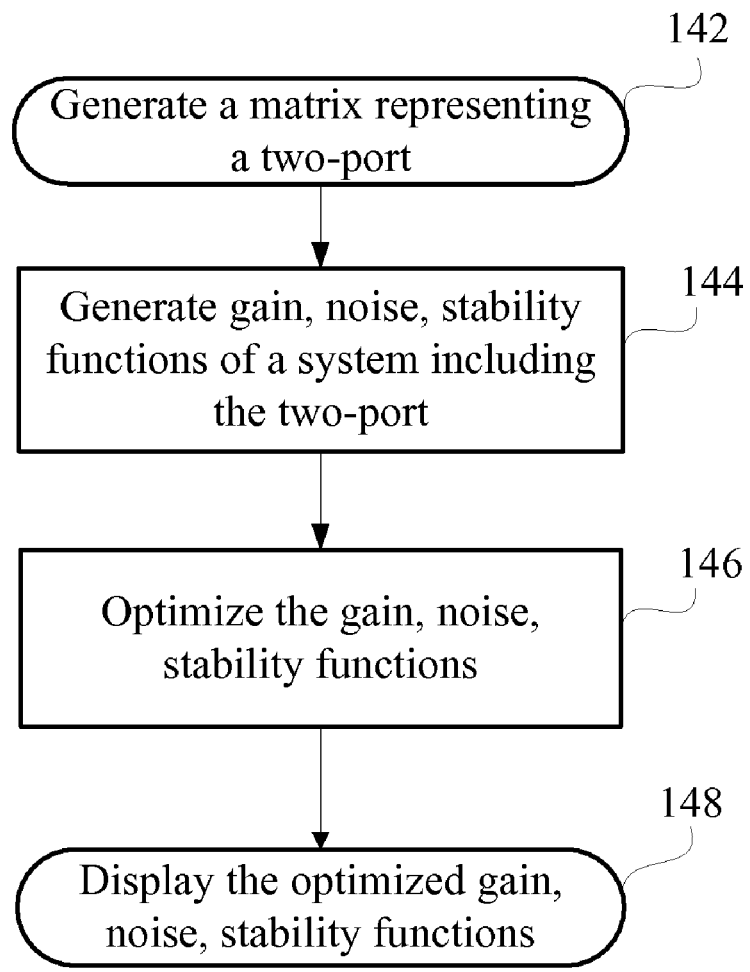
FIG. 14 shows a flowchart illustrating a method in accordance with Multiple Amplifier Matching over Lumped Networks of Arbitrary Topology.

FIG. 14 shows a flowchart illustrating a method 140 in accordance with Multiple Amplifier Matching over Lumped Networks of Arbitrary Topology. Method 140 may begin at step 142, which involves generating at least one matrix representing a two-port (see FIG. 2). In some embodiments, the matrix is a scattering matrix. In some embodiments, the two-port comprises a non-reactive multi-port modeled by an orthogonal matrix, and at least one amplifier connected to the non-reactive multi-port (see FIG. 1). The orthogonal matrix may be parameterized using an exponential map of skew-symmetric matrices. The skew-symmetric matrices may have components restricted to an interval from $-\pi$ to $\pi$. In some embodiments, one or more non-reactive lumped elements, such as resistors, capacitors, and inductors, may be connected to the non-reactive multi-port.

Method 140 may then proceed to step 144, which involves generating gain, noise, and stability functions of a system. The system may comprise the two-port, a generator connected to one port of the two-port, the generator having a generator reflectance, and a load connected to the other port of the two-port, the load having a load reflectance (see FIG. 3). The gain, noise, and stability functions generated in step 144 may be generated using the matrix generated in step 142, the generator reflectance, and the load reflectance. The generated gain, noise, and stability functions may be parameterized by the skew-symmetric matrices.

Method 140 may then proceed to step 146, which involves optimizing the gain, noise, and stability functions. In some embodiments, step 146 involves performing a trade-off analysis of the gain, noise, and stability functions. In some embodiments, such a trade-off analysis may include calculating Pareto minima.

In some embodiments, method 140 is terminated after step 146. In other embodiments, method 140 continues to step 148, which involves displaying the optimized gain, noise, and stability functions on a display connected to a computer. The optimized gain, noise, and stability functions may be displayed in a graphical format, such as the graphs shown in FIGS. 9, 10, 12, and 13, or other formats recognized by one having ordinary skill in the art. The display may be any type of display that can be connected to any type of computer.

Method 140 may be implemented using a programmable device, such as a computer-based system. Method 140 may be implemented using various programming languages, such as "C", "C++", "FORTRAN", Pascal", and "VHDL".

Various computer-readable storage mediums, such as magnetic computer disks, optical disks, electronic memories and the like, may be prepared that may contain instructions that direct a device, such as a computer-based system, to implement the steps of method 140. Once an appropriate device has access to the instructions and contained on the computer-readable storage medium, the storage medium may provide the information and programs to the device, enabling the device to perform method 140.

As an example, if a computer disk containing appropriate materials, such as a source file, an object file, an executable file or the like, were provided to a computer, the computer could receive the information, appropriately configure itself and perform the steps of method 140. The computer could receive various portions of information from the disk relating to different steps of method 140, implement the individual steps, and coordinate the functions of the individual steps.

The attached Appendix, which is incorporated herein by reference in its entirety, contains a MATLAB implementation of the SSLAM algorithm. The Appendix implementation utilizes MATLAB as the programming language, but other languages and computing approaches may be used. It is expressly understood that the MATLAB implementation is only one of several possible ways to implement the exemplary processes described in this disclosure. Thus, other forms of implementation may be used without departing from the spirit and scope of this disclosure.

Many modifications and variations of Multiple Amplifier Matching over Lumped Networks of Arbitrary Topology are possible in light of the above description. Therefore, within the scope of the appended claims, Multiple Amplifier Matching over Lumped Networks of Arbitrary Topology may be practiced otherwise than as specifically described. Further, the scope of the claims is not limited to the implementations and embodiments disclosed herein, but extends to other implementations and embodiments as may be contemplated by those having ordinary skill in the art.

What is claimed is:

1. A non-transitory computer readable storage medium having a method encoded thereon, the method represented by computer readable programming code, the method comprising the steps of:
    generating at least one matrix representing a two-port, wherein the two-port comprises:
        a non-reactive multi-port modeled by an orthogonal matrix, wherein the orthogonal matrix is parameterized using an exponential map of skew-symmetric matrices having components restricted to an interval from $-\pi$ to $\pi$, and
        at least one amplifier connected to the non-reactive multi-port;
    generating gain, noise, and stability functions of a system, wherein the system comprises:
        the two-port,
        a generator connected to one port of the two-port, the generator having a generator reflectance, and
        a load connected to the other port of the two-port, the load having a load reflectance,
        wherein the gain, noise, and stability functions are generated using the generated matrix, the generator reflectance, and the load reflectance, wherein the gain, noise, and stability functions are parameterized by the skew-symmetric matrices; and
    optimizing the gain, noise, and stability functions.

2. The non-transitory computer readable storage medium of claim 1 further comprising one or more non-reactive lumped elements connected to the non-reactive multi-port.

3. The non-transitory computer readable storage medium of claim 2, wherein the non-reactive lumped elements are selected from the group of elements consisting of resistors, capacitors, and inductors.

4. The non-transitory computer readable storage medium of claim 1, wherein the matrix is a scattering matrix.

5. The non-transitory computer readable storage medium of claim 1, wherein the step of optimizing the gain, noise, and stability functions includes the step of performing a trade-off analysis of the gain, noise, and stability functions.

6. The non-transitory computer readable storage medium of claim 1, wherein the step of performing a trade-off analysis includes calculating Pareto minima.

7. A method comprising the steps of:
    generating, by a computer, at least one matrix representing a two-port, wherein the two-port comprises:
        a non-reactive multi-port modeled by an orthogonal matrix, wherein the orthogonal matrix is parameterized using an exponential map of skew-symmetric matrices having components restricted to an interval from $-\pi$ to $\pi$, and
        at least one amplifier connected to the non-reactive multi-port;
    generating, by the computer, gain, noise, and stability functions of a system, wherein the system comprises:
        the two-port,
        a generator connected to one port of the two-port, the generator having a generator reflectance, and
        a load connected to the other port of the two-port, the load having a load reflectance, wherein the gain, noise, and stability functions are generated using the generated matrix, the generator reflectance, and the load reflectance, wherein the gain, noise, and stability functions are parameterized by the skew-symmetric matrices;

optimizing the gain, noise, and stability functions; and displaying the optimized gain, noise, and stability functions on a display connected to the computer.

8. The method of claim 7 further comprising one or more non-reactive lumped elements connected to the non-reactive multi-port.

9. The method of claim 8, wherein the non-reactive lumped elements are selected from the group of elements consisting of resistors, capacitors, and inductors.

10. The method of claim 7, wherein the matrix is a scattering matrix.

11. The method of claim 7, wherein the step of optimizing the gain, noise, and stability functions includes the step of performing a trade-off analysis of the gain, noise, and stability functions.

12. The method of claim 7, wherein the step of performing a trade-off analysis includes calculating Pareto minima.

13. The method of claim 7, wherein the step of displaying the optimized gain, noise, and stability functions on a display includes graphically displaying the optimized gain, noise, and stability functions.

14. A method comprising the steps of:

generating, by a computer, at least one scattering matrix representing a two-port, wherein the two-port comprises:

a non-reactive multi-port modeled by an orthogonal matrix, wherein the orthogonal matrix is parameterized using an exponential map of skew-symmetric matrices having components restricted to an interval from $-\pi$ to $\pi$, at least one amplifier connected to the non-reactive multi-port, and one or more resistors, capacitors, and inductors connected to the non-reactive multi-port;

generating, by the computer, gain, noise, and stability functions of a system, wherein the system comprises:

the two-port, a generator connected to one port of the two-port, the generator having a generator reflectance, and a load connected to the other port of the two-port, the load having a load reflectance, wherein the gain, noise, and stability functions are generated using the generated matrix, the generator reflectance, and the load reflectance, wherein the gain, noise, and stability functions are parameterized by the skew-symmetric matrices;

optimizing the gain, noise, and stability functions; and graphically displaying the optimized gain, noise, and stability functions on a display connected to the computer.

15. The method of claim 14, wherein the step of optimizing the gain, noise, and stability functions includes the step of performing a trade-off analysis of the gain, noise, and stability functions.

16. The method of claim 15, wherein the step of performing a trade-off analysis includes calculating Pareto minima.

* * * * *